United States Patent
Chan et al.

(10) Patent No.: US 9,653,561 B2
(45) Date of Patent: May 16, 2017

(54) LOW ON RESISTANCE SEMICONDUCTOR DEVICE

(71) Applicant: Macronix International Co, Ltd., Hsin-chu (TW)

(72) Inventors: Wing-Chor Chan, Hsinchu (TW); Shyi-Yuan Wu, Hsin-Chu (TW)

(73) Assignee: Macronix International Co., Ltd., Hsin-chu (TW)

( * ) Notice: Subject to any disclaimer, the term of this patent is extended or adjusted under 35 U.S.C. 154(b) by 0 days.

(21) Appl. No.: 13/903,539

(22) Filed: May 28, 2013

(65) Prior Publication Data

US 2014/0264581 A1    Sep. 18, 2014

Related U.S. Application Data

(60) Provisional application No. 61/776,835, filed on Mar. 12, 2013.

(51) Int. Cl.
*H01L 29/66* (2006.01)
*H01L 29/423* (2006.01)
*H01L 29/78* (2006.01)
*H01L 29/06* (2006.01)
(Continued)

(52) U.S. Cl.
CPC .... *H01L 29/42368* (2013.01); *H01L 29/0634* (2013.01); *H01L 29/0653* (2013.01); *H01L 29/0692* (2013.01); *H01L 29/0878* (2013.01); *H01L 29/402* (2013.01); *H01L 29/42356* (2013.01); *H01L 29/66681* (2013.01); *H01L 29/7816* (2013.01); *H01L 29/7835* (2013.01); *H01L 29/42376* (2013.01)

(58) Field of Classification Search
CPC ......... H01L 29/66681; H01L 29/42368; H01L 29/402; H01L 29/42356; H01L 29/42376
See application file for complete search history.

(56) References Cited

U.S. PATENT DOCUMENTS

| 5,801,418 A | 9/1998 | Ranjan |
| 6,620,688 B2 | 9/2003 | Woo et al. |
| 2003/0107081 A1* | 6/2003 | Lee et al. ............ 257/344 |

(Continued)

FOREIGN PATENT DOCUMENTS

TW    201225292 A    6/2012

OTHER PUBLICATIONS

Intellectual Property Office, Ministry of Economic Affairs, R.O.C., Office Action for Application No. 10421553780, Nov. 18, 2015, 8 pages, Taiwan.

*Primary Examiner* — Asok K Sarkar
*Assistant Examiner* — Mark Hatzilambrou
(74) *Attorney, Agent, or Firm* — Alston & Bird LLP

(57) ABSTRACT

A semiconductor device is provided having a dual dielectric layer structure defined by a thin dielectric layer adjacent to a thick dielectric layer. More particularly, a high voltage metal oxide semiconductor transistor having a dual gate oxide layer structure comprising a thin gate oxide layer adjacent to a thick oxide/thin oxide layer may be provided. Such structures may be used in extended drain metal oxide semiconductor field effect transmitters, laterally diffused metal oxide field effect transistors, or any high voltage metal oxide semiconductor transistor. Methods of fabricating an extended drain metal oxide semiconductor transistor device are also provided.

16 Claims, 15 Drawing Sheets

(51) Int. Cl.
*H01L 29/08* (2006.01)
*H01L 29/40* (2006.01)

(56) References Cited

U.S. PATENT DOCUMENTS

| | | | |
|---|---|---|---|
| 2005/0062125 A1* | 3/2005 | Kitaguchi | 257/492 |
| 2008/0315308 A1* | 12/2008 | Huang | H01L 29/0847 257/343 |
| 2010/0102388 A1* | 4/2010 | Levin et al. | 257/343 |
| 2012/0126323 A1* | 5/2012 | Wu et al. | 257/343 |
| 2012/0168842 A1* | 7/2012 | Wang | 257/316 |

\* cited by examiner

LOW ON RESISTANCE SEMICONDUCTOR DEVICE

CROSS-REFERENCE TO RELATED APPLICATIONS

This application claims priority to U.S. Provisional Application Ser. No. 61/776,835 filed Mar. 12, 2013, the contents of which is fully incorporated herein by reference.

TECHNOLOGICAL FIELD

The present invention generally relates to a semiconductor device having an increased breakdown voltage but without a substantial increase in the specific on resistance. In particular, the present invention relates to high voltage metal oxide semiconductor transistors having such device characteristics. However, the present invention may be extended to floating gate semiconductor devices.

BACKGROUND

FIG. 1 illustrates a cross-sectional view of a conventional extended drain metal oxide semiconductor field effect transistor (EDMOSFET). Generally, a MOS comprises a gate region 80, a source region 90, and a drain region 95. The MOS transistor 1 of this exemplary representation is disposed upon a substrate 10 having a deep n-type well 25 disposed along the substrate 10. The substrate 10 may be a p-type substrate or p-type backgate for an n-channel MOS (nMOS) transistor or an n-type substrate or n-type backgate for a p-channel MOS (pMOS) transistor.

A p-type well 30 is disposed in the deep n-type well 25 at the source region 90. A p doped source region 35 and an n doped source region 40 are disposed in the p-type well 30 and define a contact area for the source region 90. An n doped drain region 45 defines a contact area for the drain region 95. A dielectric layer 50 that may be a field oxide layer defines the bounds of the contact area for the drain region 95 and the contact area for the source region 90. A conductive layer 70 that may be a polysilicon layer is disposed across a portion of the dielectric layer 50 and the gate oxide layer 60.

The MOS transistor has three modes of operation depending upon the terminal voltages. For example, a MOS transistor has terminal voltages $V_g$ (gate terminal voltage), $V_s$ (source terminal voltage), and $V_d$ (drain terminal voltage). The nMOS operates in a cutoff mode when a bias voltage $V_{gs}$ between the gate and the source is less than the threshold voltage $V_{th}$ of the MOS transistor. Essentially, in the cutoff mode, no channel develops and the current $I_{ds}$ in the channel region is zero.

The nMOS operates in a linear mode when the bias voltage $V_{gs}$ exceeds the threshold voltage $V_{th}$ as long as a channel voltage $V_{ds}$ does not exceed a saturation voltage $V_{ds,sat}$. Typically, the saturation voltage is defined as the bias voltage $V_{gs}$ less the threshold voltage $V_{th}$. The current $I_{ds}$ increases with the channel voltage $V_{ds}$ when the nMOS is in the linear mode. Finally, the channel pinches off and the current saturates when the channel voltage $V_{ds}$ exceeds the saturation voltage $V_{ds,sat}$. $I_{ds}$ is independent of $V_{ds}$ when the nMOS transistor is in this saturation mode.

An extended drain metal oxide semiconductor field effect transistor (EDMOSFET) transistor is characterized by a relative high specific on resistance (RON) especially in comparison to a laterally diffused metal oxide semiconductor field effect transistor (LDMOSFET). However, the EDMOSFET is characterized as having a reduced number of mask layers over the LDMOSFET. Conventionally, the breakdown voltage of the EDMOSFET and LDMOSFET have been increased by reducing the concentration of dopant in the drift region, which is compensated for by increasing the length of the drift region. This results in an increase in the RON.

Thus, without intending to be limiting, conventionally the current of MOS transistors may depend upon the type of dopant and the extent of doping in any of the regions of the semiconductor, the dielectric thickness and the dielectric material, and the gate material. Moreover, as disclosed herein, conventional changes in the design of the MOS transistor that increase the breakdown voltage also increase the RON. There remains a need in the art for a MOS design that increases the breakdown voltage but without substantially affecting the RON of the MOS transistor. Conversely, there remains a need in the art to reduce the RON without substantially changing a desired breakdown voltage of the MOS transistor.

Further, a long-felt need in the art has been to further reduce the size of power semiconductor devices still having increased breakdown voltages yet without substantially compromising the RON.

BRIEF SUMMARY OF EXEMPLARY EMBODIMENTS

Embodiments of devices of the present invention are therefore provided that may provide a semiconductor device having an increased breakdown voltage but without substantially changing the specific on resistance of the device. Embodiments of devices of the present invention may also be provided that may provide a semiconductor device having reduced specific on resistance without substantially affecting a breakdown voltage of the device.

An aspect of the invention provides semiconductor device comprising a dual dielectric layer having a thin dielectric layer adjacent to a thick dielectric layer, an isolation layer disposed upon the thick dielectric layer, and a first conductive layer that may be disposed along the thin dielectric layer having a stepped portion disposed at least in part along the isolation layer.

In an embodiment of the invention, the semiconductor device may comprise a second conductive layer. For example, according to certain embodiments of the invention, the second conductive layer may be disposed above a portion of the first conductive layer and the isolation layer and an inter-conductor oxide layer disposed between the second conductive layer and the portion of the first conductive layer and the isolation layer.

In certain embodiments of the invention, the thin dielectric layer may be a thin gate oxide layer and the thick dielectric layer may be a thick gate oxide layer. Further pursuant to this embodiment, a thickness of the thick gate oxide layer, the isolation layer, and the inter-conductor oxide layer at the edge of the second polysilicon layer is in a range of from about 370 Å to about 1880 Å.

According to certain embodiments of the invention, the first conductive layer and/or the second conductive layer may comprise a polysilicon. In some embodiments of the invention, the inter-conductor oxide layer is an oxide layer deposited using a high temperature oxide deposition process.

An aspect of the invention also provides a high voltage metal oxide semiconductor (HVMOS) transistor comprising a substrate, a dual gate oxide structure disposed along the substrate, and a two conductive layer structure. According to an embodiment of the invention, the dual gate oxide structure has a thin gate oxide layer adjacent to a thick gate oxide layer and an isolation layer disposed upon the thick gate oxide layer.

In certain embodiments of the invention, the two conductive layer structure comprises a first conductive layer disposed along the thin gate oxide layer having a stepped portion disposed at least in part along the isolation layer, a second conductive layer disposed above a portion of the first conductive layer and the isolation layer, and an inter-conductor oxide layer disposed between the second conductive layer and the portion of the first conductive layer and the isolation layer. In certain embodiments of the invention, the inter-conductor oxide layer of the HVMOS transistor comprises a high temperature oxide.

In an embodiment of the invention, the HVMOS transistor additionally comprises an n⁻ well disposed in the substrate below the two conductive layer structure and a p-type implant disposed in the n⁻ well. According to an embodiment of the invention, a p-type ion of the p-type implant is selected such that the p-type ion is subject to easy out-diffusion. Further pursuant to this embodiment of the invention, a concentration of dopant in the p-type implant is in a range of from about $5 \times 10^{12}/cm^3$ to about $1 \times 10^{14}/cm^3$.

The HVMOS transistor, according to an embodiment of the invention, may have a reduction in its effective channel length in a range of from about 0.2 μm to about 1 μm in comparison to an HVMOS transistor not having the dual gate oxide structure, the p-type implant, and the n⁻ well.

In another embodiment of the invention, the HVMOS transistor additionally comprises an n-type doped drain (NDD) area disposed in the substrate extending from a drain region to a point below the two conductive layer structure. Further pursuant to this embodiment, the inventive HVMOS transistor has a reduction in its effective channel length in a range of from about 0.2 μm to about 1 μm in comparison to an HVMOS transistor not having the dual gate oxide structure and the NDD area.

In an embodiment of invention, the HVMOS transistor may be substantially free of a quasi-saturation region. In certain embodiments of the invention, a slope of a drain-to-source current relative to a drain-to-source voltage is at least about $6 \times 10^{-5}$ ampere/μm-volt in a transition region established between a substantially linear slope to a saturation region.

In still another embodiment of the invention, the HVMOS transistor additionally comprises an n⁻ implant disposed in the substrate that extends across an upper part of an n-type well and an n doped drain region and terminates at a point below the thick gate oxide layer. In certain embodiments of the invention, the n⁻ implant terminates below the two conductive layer structure at about the point where an edge of the second conductive layer is aligned with the inter-conductor oxide layer and the isolation layer.

In yet still another embodiment of the invention, the substrate comprising a p-body region and a p doped source region and an n doped source region disposed in the p-body region configured to define a contact area for the source region.

In still other embodiments of the invention, the HVMOS transistor may additionally comprise a p-type well having a p doped source region and an n doped source region that define a contact area for a source region; and an n-type well adjacent to the p-type well, the n-type well having an n doped drain regain that defines a contact area for a drain region.

In certain embodiments of the invention, the first conductive layer is a first polysilicon layer and the second conductive layer is a second polysilicon layer. In an embodiment of the invention, the two conductive layer structure may be configured to define a poly-insulator-poly (PIP) capacitor.

An aspect of the invention provides methods of fabricating a semiconductor device, such as, for example, an extended drain metal oxide semiconductor transistor device according to an embodiment of the invention.

The method of fabricating a semiconductor device, according to an embodiment of the invention, may comprise, for example, providing a semiconductor device having a substrate, a deep-n-type well, and an oxide layer; implanting an n-type well and a p-type well; driving in the n-type well and the p-type well; applying a silicon nitride layer; forming a field oxide layer; removing the silicon nitride layer and the oxide layer; forming a thick gate oxide; forming a thin gate oxide, a part of the thin gate oxide disposed along the thick gate oxide; forming a first conductive layer, the first conductive layer disposed along at least a portion of the thin gate oxide including at least a portion of the part of the thin gate oxide disposed along the thick gate oxide; applying a high temperature oxide layer; and forming a second conductive layer, the high temperature oxide layer separating the second conductive layer from the first conductive layer and the thin oxide a layer along which the second conductive layer is disposed.

The method of fabricating a semiconductor device may additionally comprise implanting an n− doped region; depositing a tetraethyl orthosilicate (TEOS) layer on the first conductive layer, etching the TEOS layer to form a spacing layer; implanting an n+ doped drain region; implanting an n+ doped source region; and implanting a p+ doped source region.

In a non-limiting exemplary embodiment of the invention, the step of forming a thick gate oxide layer may comprise depositing a thick gate oxide layer; applying a thick gate oxide photoresist layer; etching the thick gate oxide layer; and removing the thick gate photoresist layer.

These embodiments of the invention and other aspects and embodiments of the invention will become apparent upon review of the following description taken in conjunction with the accompanying drawings. The invention, though, is pointed out with particularity by the appended claims.

BRIEF DESCRIPTION OF THE SEVERAL VIEWS OF THE DRAWING(S)

Having thus described the invention in general terms, reference will now be made to the accompanying drawings, which are not necessarily drawn to scale, and wherein:

DETAILED DESCRIPTION

Some embodiments of the present invention will now be described more fully hereinafter with reference to the accompanying drawings, in which some, but not all embodiments of the invention are shown. Indeed, various embodiments of the invention may be embodied in many different forms and should not be construed as limited to the embodiments set forth herein; rather, these embodiments are provided so that this disclosure will satisfy applicable legal requirements.

As used in the specification and in the appended claims, the singular forms "a", "an", and "the" include plural referents unless the context clearly indicates otherwise. For example, reference to "a semiconductor device" includes a plurality of such semiconductor devices.

Although specific terms are employed herein, they are used in a generic and descriptive sense only and not for purposes of limitation. All terms, including technical and scientific terms, as used herein, have the same meaning as commonly understood by one of ordinary skill in the art to which this invention belongs unless a term has been otherwise defined. It will be further understood that terms, such as those defined in commonly used dictionaries, should be interpreted as having a meaning as commonly understood by a person having ordinary skill in the art to which this invention belongs. It will be further understood that terms, such as those defined in commonly used dictionaries, should be interpreted as having a meaning that is consistent with their meaning in the context of the relevant art and the present disclosure. Such commonly used terms will not be interpreted in an idealized or overly formal sense unless the disclosure herein expressly so defines otherwise.

Figure 1:
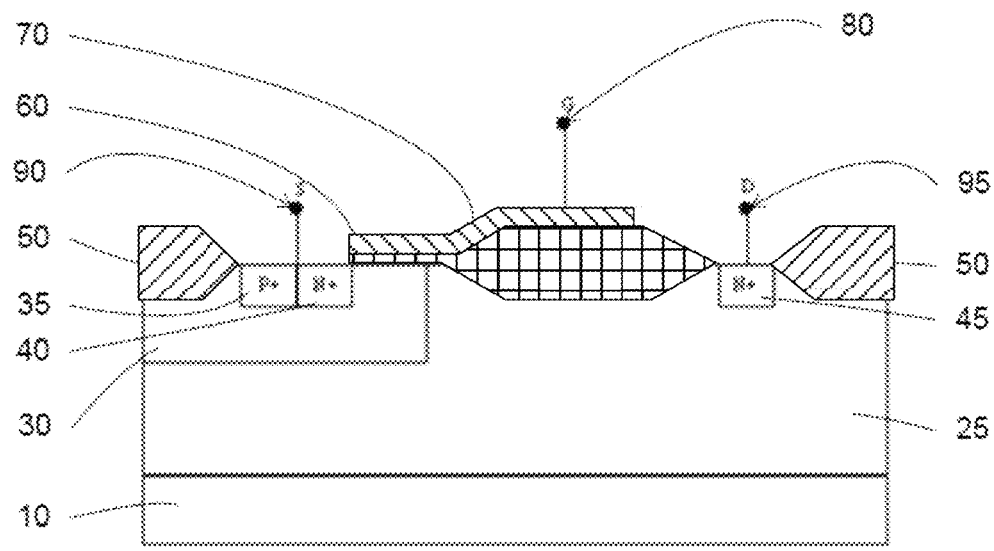
FIG. 1 is a cross-sectional view illustrating a conventional metal oxide semiconductor device.
Figure 2:
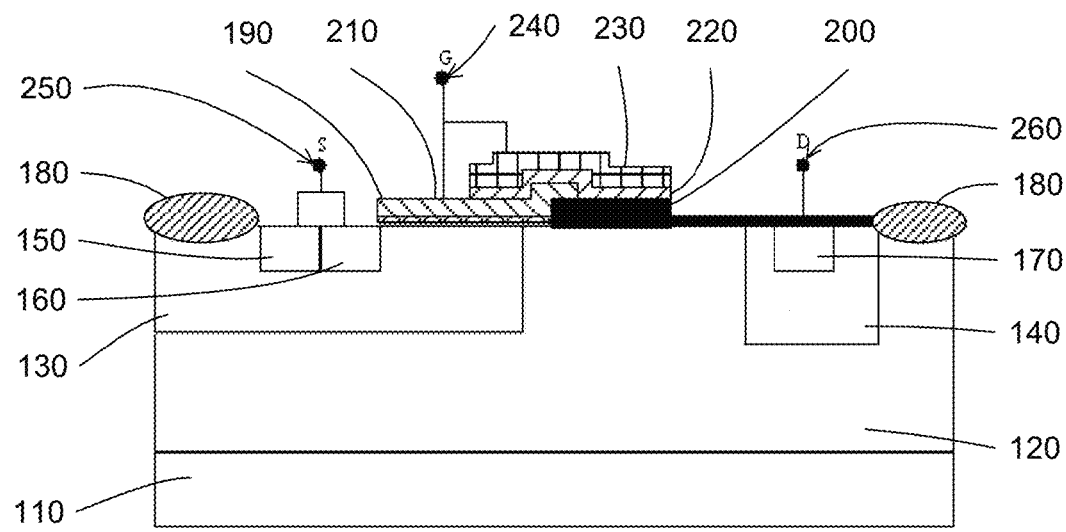
FIG. 2 is a cross-sectional view illustrating an extended drain metal oxide semiconductor transistor according to an embodiment of the invention.

The inventors have conceived of a dual gate oxide layer for providing a MOS controlled power semiconductor device. FIG. 2 is an exemplary illustrative embodiment of a cross-section of the MOS device according to an embodiment of the invention. FIG. 2 is an exemplary extended drain metal oxide semiconductor (EDMOS) transistor showing one type of semiconductor device of the invention. The EDMOS 100 of FIG. 2 has a substrate 110, for example a p-type substrate, upon which is disposed a deep n-type well 120. Disposed within the deep n-type well 120 is a p-type well 130 at a source region 250 and an n-type well 140 at a drain region 260. A p doped source region 150 and an n doped source region 160 are disposed in the p-type well 130 and define a contact area for the source region 250. An n doped drain region 170 disposed in the n-type well 140 define a contact region for the drain region 260.

A dielectric layer 180 defines an outer bound of the p doped source region 150 of the contact area for the source region 250 and an outer bound of the n-type well 140 at the drain region 260. A dielectric layer commences just where the contact area of the source region 250 ends at the n doped source region 160 and continues approximately to an inside boundary of the n-type well 140 at the drain region 260. According to the illustrative embodiment of FIG. 2, this dielectric layer comprises a thin oxide layer 190 and a thick oxide/thin oxide layer 200. In an embodiment of the invention, the thin oxide layer 190 and the thick oxide/thin oxide layer 200 may be a gate oxide layer.

A two conductive layer structure defining the gate region 240 is disposed on the dielectric layer comprising the dual gate oxide layer of the invention. For example, as shown in the illustrative embodiment of FIG. 2, the two conductive layer structure comprises a first polysilicon layer 210 and a second polysilicon layer 230 separated by an inter-conductor oxide layer that is a high temperature oxide (HTO) layer 220 according to this embodiment. In the illustrative embodiment of FIG. 2, the first polysilicon layer 210 is disposed across the thin oxide layer 190, and a portion of the first polysilicon layer 210. In certain embodiments of the invention, the thin oxide layer 190 may be disposed, at least in part, along the thick oxide/thin oxide layer 200. More precisely, the first polysilicon layer 210 continues along the thin oxide layer 190 at a substantially constant thickness, and then the first polysilicon layer 210 "steps up" to stepped region and becomes thicker as it continues along the thin oxide 190. At the point where the thin oxide layer 190 becomes disposed across the thick oxide/thin oxide layer 200, the thickness of the first polysilicon layer 210 changes to accommodate the thick oxide/thin oxide layer 200. The first polysilicon layer 210 continues to extend into the region where thin oxide layer 190 is disposed along the thick oxide/thin oxide layer 200. The remaining part where thin oxide layer 190 is disposed along the thick oxide/thin oxide layer 200 not covered by the first polysilicon layer will contact the HTO layer 220.

The second polysilicon layer 230, which is separated by the HTO layer 220, is disposed at some portion inwardly from the first polysilicon layer 210, and the HTO layer 220 and the second polysilicon layer 230 conformally extends along an outer surface of the first polysilicon layer 210 to a terminus of the two conductive layer structure. In effect, the second polysilicon layer 210 and the HTO layer 220 are configured to form a field plate at the drift region to protect the drift region from charge effects that may otherwise result in increased breakdown voltage.

As shown in the illustrative embodiment of FIG. 2, the terminus of the two conductive layer structure may be before the point where the n doped source region 160 begins. Thus a portion of the thick oxide/thin oxide layer 200 may continue to extend to the point where the n doped source region 160 begins at the drain region 260.

While the embodiment of FIG. 2 is described in the context of the two conductive layer structure having polysilicon layers, either or both of the conductive layers may, in certain embodiments, comprise any material or materials known in the art that functions as a conductive material. Indeed, the conductive material of the first conductive layer may be the same as or different from the conductive material of the second conductive layer. In certain embodiments of the invention, the first conductive layer and the second conductive layer may have geometries that are different than shown in the illustrative embodiments of the invention and different from those as described herein.

According to certain embodiments of the invention, the gate material of the two conductive layer structure may be a polysilicon, a metal, or a silicide polysilicon. The inter-poly insulator may be an oxide or an oxide-nitride-oxide (ONO) or a high K insulator. In certain embodiments of the invention, the first conductive layer and the second conductive layer may be configured to have substantially the same bias voltages. In certain other embodiments of the invention, the first conductive layer and the second conductive layer may be configured to have different bias voltages.

Without intending to be bound by theory, the composite dual gate oxide structure of the invention increases the breakdown voltage between the gate region 240 and the drain region 260 and the current flow path in the drift region is effectively reduced to decrease the RON of the device in comparison to a conventional extended drain metal oxide semiconductor field effect transistor (EDMOSFET).

In an embodiment of the invention, a total thickness of an inter-conductor oxide layer (the HTO layer in certain embodiments), an isolation layer, and a thick dielectric layer (the thick gate oxide in certain embodiments) at the edge of a second conductive layer (the second polysilicon layer in certain embodiments) is of such a thickness to increase breakdown voltage. In an embodiment of the invention, the total thickness of the aforementioned layers may be in a range of from about 370 Å to about 1880 Å at the edge of the second conductive layer. In an embodiment of the invention, a thickness of the thin oxide layer may be from about 50 Å to about 180 Å, a thickness of the thick gate oxide layer may be from about 120 Å to about 1100 Å, and a thickness of the HTO layer may be from about 200 Å to about 600 Å. In certain embodiments of the invention, a thickness of a thin oxide layer, which may be a gate oxide layer, is from about 50 Å to about 180 Å. In certain other embodiments of the invention, a thickness of a thick oxide layer, which may be a gate oxide layer, is from about 50 Å to about 180 Å. In yet certain other embodiments of the invention, the inter-conductor oxide layer separating the first conductive layer from the second conductive layer, which may be an oxide deposited using a high temperature oxide deposition, is from about 200 Å to about 600 Å.

In certain embodiments of the invention, the total oxide at the second polysilicon layer is structure to provide a contribution to the breakdown voltage of about 10.8 MV/cm. Further pursuant to these embodiments of the invention, the breakdown voltage between the edge of the second polysilicon layer to the drain region is in a range of from about 39 V to about 200 V.

In some embodiments of the invention, the drift region generally comprises a p-type well and an n-type well but perhaps in different configurations as further described herein. In an embodiment of the invention, the n-type well may be an n minus well. Further pursuant to these embodiments, but without intending to be bound by theory, the n minus well may help to reduce the effective channel length and the resistance of the drift region.

According to certain embodiments of the invention, an n-type double drain (NDD) layer may be implanted in the drift region. In certain embodiments of the invention, but without intending to be bound by theory, the NDD layer may reduce the RON of the device.

In certain embodiments of the invention, the material of the p-type well is such that it is an easy out-diffusion to the oxide layer. Without intending to be bound by theory, such a p-type material may server to reduce effective channel length and perhaps channel resistance.

The dual oxide layers of the invention may be formed using any technique known in the art in forming an oxide layer. According to an embodiment of the invention, a gate oxide layer may be applied using a local oxidation of silicon process (LOCOS) process.

In an embodiment, the invention may be applied to semiconductor devices fabricated using a shallow trench isolation (STI) process. In certain embodiments, the invention is applied to a semiconductor device fabricated using a deep trench isolation (DTI) process. In still other embodiments of the invention, the dual gate oxide structure and the multiple lateral reduced surface field (multi RESURF) structure of the invention may be applied to a semiconductor device having a silicon-on-insulator (SOI) structure. In yet other embodiments of the invention, the dual gate oxide structure and the RESURF structure of the invention may be applied to a semiconductor fabricated according to any one or any combination of an N-EPI process, a P-EPI process, and/or a non-EPI process.

In certain embodiments of the invention, the dual gate oxide structure and the RESURF power semiconductor of the invention may be applied to an n-channel EDMOS. In other embodiments of the invention, the dual gate oxide structure and the RESURF power semiconductor of the invention may be applied to a p-channel EDMOS. In yet other embodiments of the invention, the dual gate oxide structure and the RESURF power semiconductor of the invention may be applied to an n-channel laterally diffused metal oxide semiconductor field effect transistor (LDMOS-FET). In still yet other embodiments of the invention, the dual gate oxide structure and the RESURF power semiconductor of the invention may be applied to a p-channel LDMOSFET.

Figure 3A:
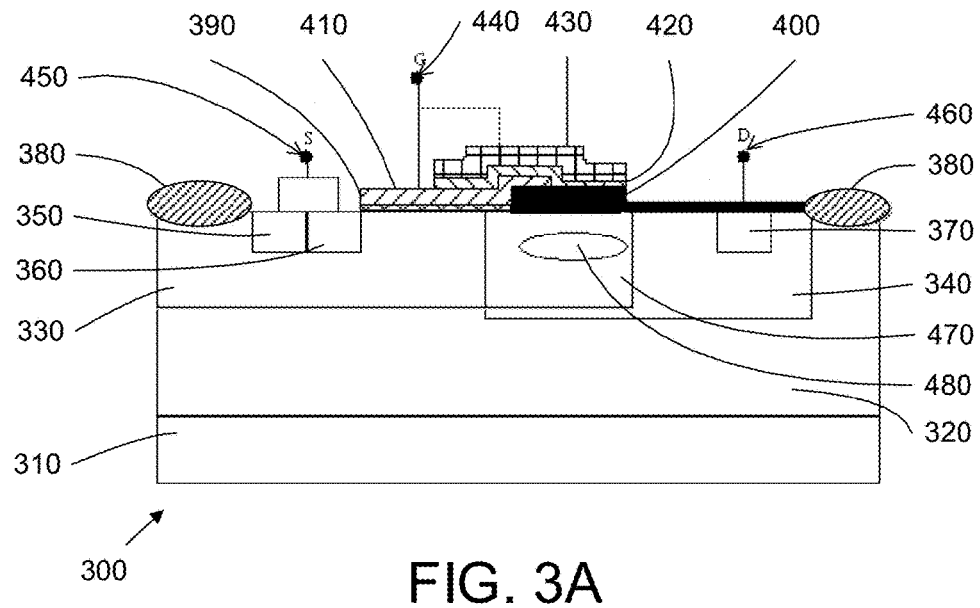
FIG. 3A is a cross-sectional view illustrating an extended drain metal oxide semiconductor transistor according to another embodiment of the invention.

FIG. 3A is a cross-sectional view illustrating an EDMOS transistor according to another embodiment of the invention. The EDMOS 300 of FIG. 3A comprises a substrate 310 upon which is disposed a deep n-type well 320. An n⁻ well (n minus well) 470 is disposed between a p-type well 330 at a source region 450 and an n-type well 340 at a drain region 460. A p doped source region 350 and an n doped source region 360 are disposed in the p-type well 330 and define a contact area for the source region 450, while an n doped drain region 370 disposed in the n-type well 340 define a contact region for the drain region 460.

A dielectric layer 380 defines an outer bound of the p doped source region 350 of the contact area for the source region 450 and an outer bound of the n-type well 340 at the drain region 460. A two conductive layer structure defining a gate region 440 separates the source region 450 from the drain region 460. As further described herein, the two conductive layer structure comprises a dual oxide gate oxide layer of the invention having a thin oxide layer 390 and a thick oxide/thin oxide layer 400. The two conductive layer structure comprises a first conductive layer that may be a first polysilicon layer 410 and a second conductive layer that may be a second conductive layer 430, the first conductive layer and the second conductive layer separated by a dielectric layer such as an HTO layer 420.

A n⁻ implant region or a P-Field implant 480 is disposed in the n minus well 470. In an embodiment of the invention, the p-type ions may be, for example, boron. In certain embodiments of the invention, the p-type ions of the P-Field implant 480 are selected such that they are subject to easy out-diffusion after a n⁻ implant drive-in process. In certain embodiments of the invention, a concentration of dopant in the P-Field implant 480 is in a range of from about $5 \times 10^{12}/cm^3$ to about $1 \times 10^{14}/cm^3$.

Figure 3B:
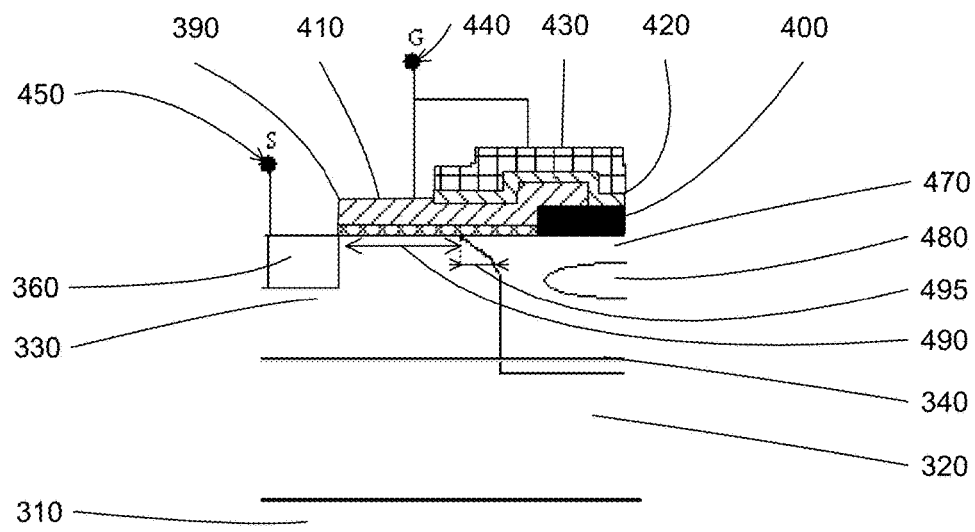
FIG. 3B is a detailed cross-sectional view of a portion of the extended drain metal oxide semiconductor transistor of FIG. 3A.

FIG. 3B is a detailed cross-sectional view of a portion of the EDMOS transistor 300 of FIG. 3A showing channel 490. FIG. 3B shows an effective length of the channel 490 is reduced by including the P-Field implant 480 disposed in the n minus well 470, which is adjacent to the p-type well 330 and the n-type well 340. According to an embodiment of the invention, a reduction in the effective length 495 of the channel may be in a range of from about 0.2 µm to about 1 µm.

Figure 4A:
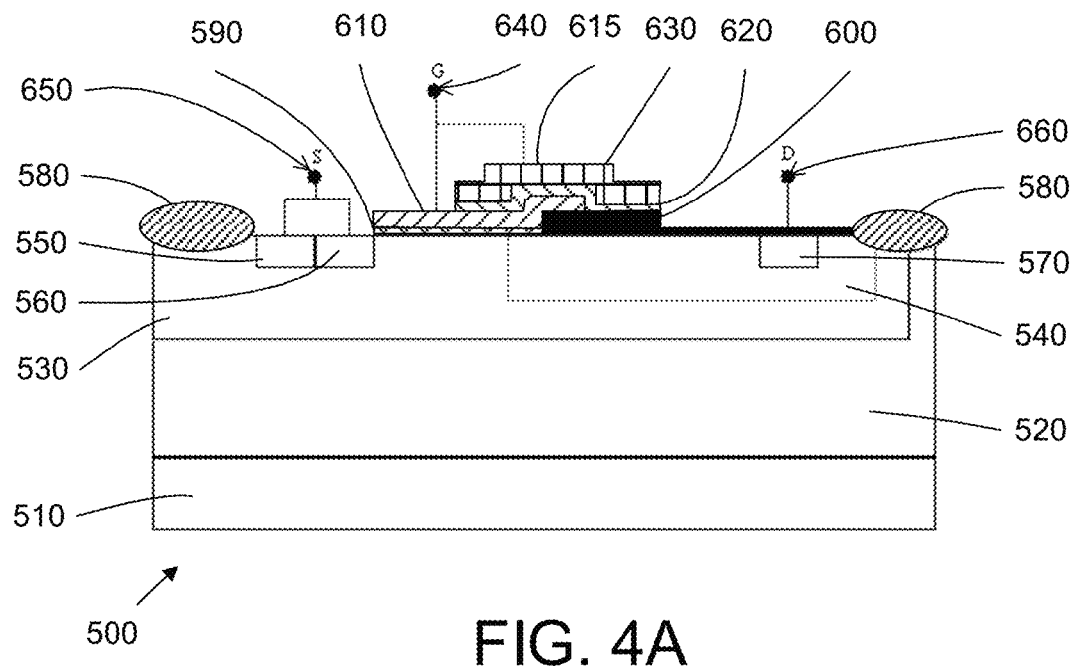
FIG. 4A is a cross-sectional view illustrating an extended drain metal oxide semiconductor transistor according to another embodiment of the invention.

FIG. 4A is a cross-sectional view illustrating an EDMOS transistor according to another embodiment of the invention. The EDMOS 500 of FIG. 4A comprises a substrate 510 upon which is disposed a deep n-type well 520. An n-type doped drain (NDD) area 540 forms into a part of a p-type well 530. A p doped source region 550 and an n doped source region 560 are disposed in the p-type well 530 and define a contact area for the source region 650, while an n doped drain region 570 disposed in the NDD area 540 to define a contact region for the drain region 660.

A dielectric layer 580 defines an outer bound of the p doped source region 550 of the contact area for the source region 650 and an outer bound of the NDD area 540 at the drain region 660. A two conductive layer structure defining a gate region 640 separates the source region 650 from the drain region 660. As further described herein, the two conductive layer structure comprises a dual oxide gate oxide layer of the invention having a thin oxide layer 590 and a thick oxide/thin oxide layer 600. The two conductive layer structure comprises a first conductive layer that may be a first polysilicon layer 610 and a second conductive layer that may be a second conductive layer 630, the first conductive layer and the second conductive layer separated by a dielectric layer such as an HTO layer 620.

Figure 4B:
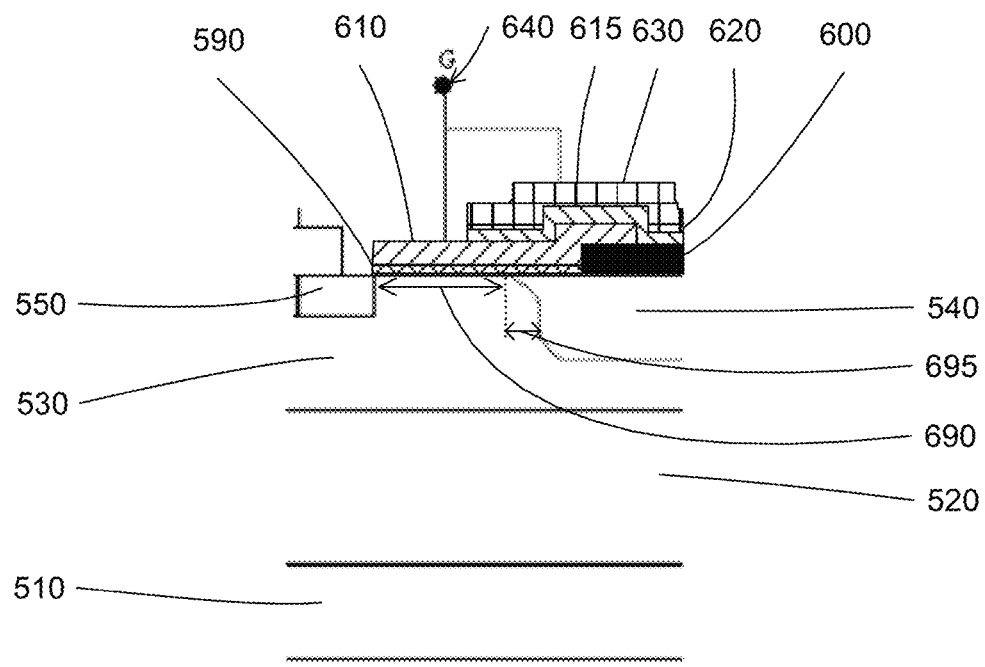
FIG. 4B is a detailed cross-sectional view of a portion of the extended drain metal oxide semiconductor transistor of FIG. 4A.

According to the illustrative embodiment of FIG. 4A, the NDD area 540 may be implanted to extend from the drain region 660 into, at least in part, a portion of the p-type well 530 terminating at a point below the two conductive layer structure of the gate region 640. FIG. 4B is a detailed cross-sectional view of a portion of the EDMOS transistor 500 of FIG. 4A showing channel 690. FIG. 4B shows an effective length of the channel 690 may be reduced by extending the NDD area 540 into the p-type well 530 terminating just below the two conductive layer structure of the gate region 640. According to an embodiment of the invention, the NDD area 540 may terminate at a point below the first polysilicon layer 610. According to certain embodiments of the invention, the NDD area 540 terminates below the first polysilicon layer 610 before a stepped portion 615 of the first polysilicon layer 610 steps up and becomes thicker. According to an embodiment of the invention, a reduction in the effective length 695 of the channel may be in a range of from about 0.2 µm to about 1 µm.

Figure 5A:
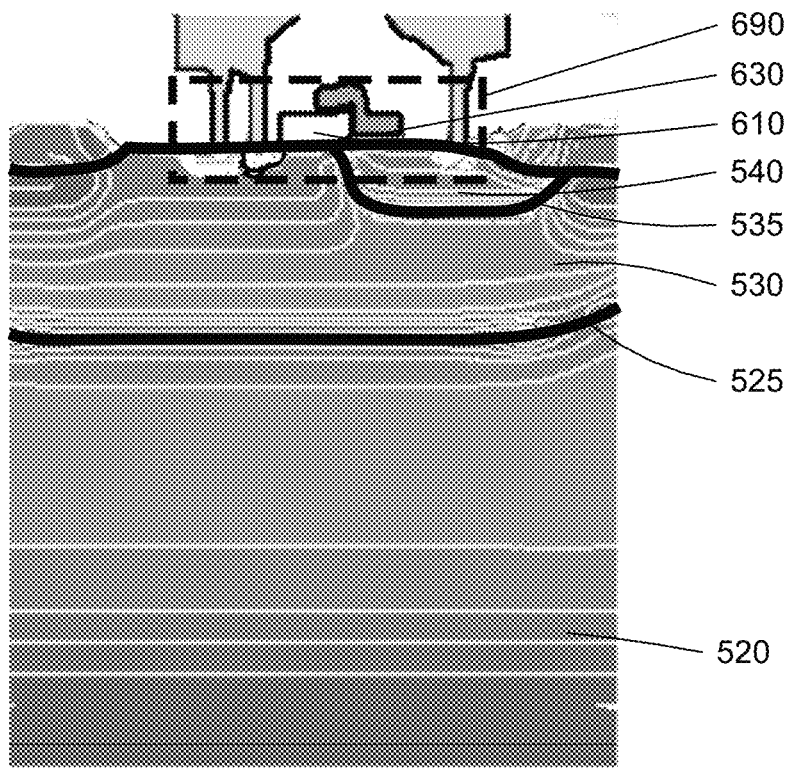
FIG. 5A is a TCAD simulation of the electrical characteristics of the extended drain metal oxide semiconductor of FIG. 4A.
Figure 5B:
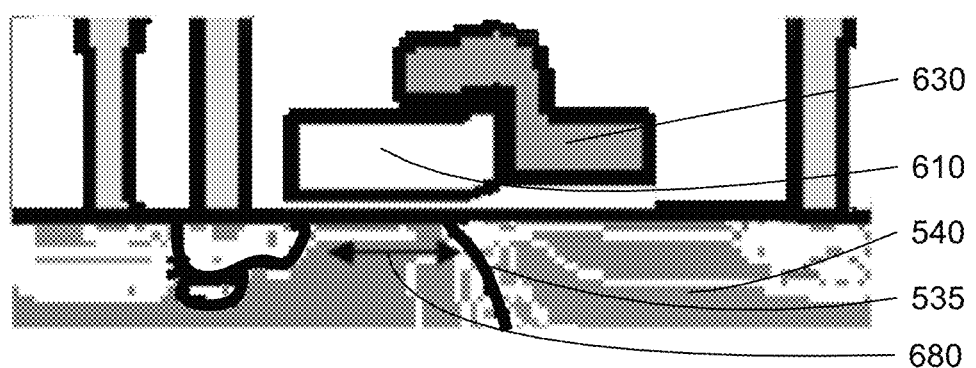
FIG. 5B is a detailed view of the TCAD simulation of FIG. 5A.

FIG. 5A is a TCAD simulation of the electrical characteristics of the EDMOS 500 of FIG. 4A. FIG. 5B is a detailed view taken about 690 of the TCAD simulation of FIG. 5A. A first p-n junction 525 is shown between the deep n-type well 520 and the p-type well 530. A second p-n junction 535 is shown between the p-type well 530 and the NDD area 540. The left side of the second p-n junction 535 shows the effective channel length 680 and the effects of the interface of the NDD area 540 with the p-type well 530 in reducing the effective channel length 680.

Figure 6A:
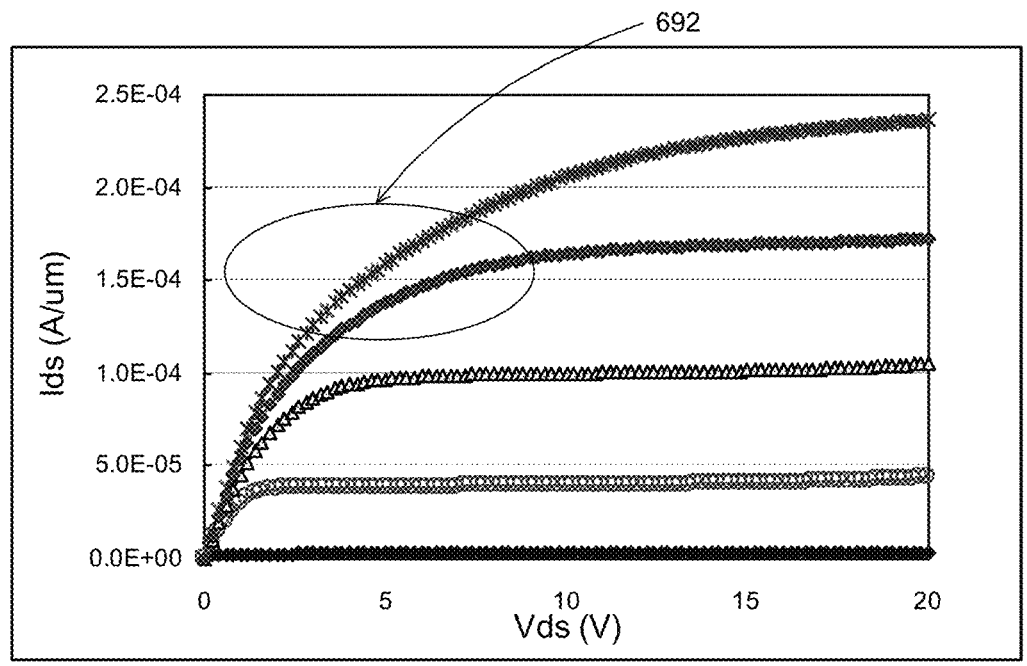
FIG. 6A is a graphical representation of the drain-source voltage to the drain-source current in a conventional extended drain metal oxide semiconductor.

FIG. 6A is a graphical representation of the drain-source voltage ($V_{ds}$) to the drain-source current ($I_{ds}$) in a conventional extended drain metal oxide semiconductor. FIG. 6A shows the "quasi-saturation effect" experienced by conventional EDMOS transistors. The "quasi-saturation effect" is illustrated in region 692 and defines the response of the current $I_{ds}$ between the drain and source regions of a high voltage MOS device with increasing voltage $V_{ds}$ across the drain and source regions. As FIG. 6A shows, there is not a marked saturation voltage region where $I_{ds}$ approaches a well-defined current at saturation. Rather, in the quasi-saturation region, the peak electric field in the drift region and the channel current is not easily saturated, and a non-linear resistive behavior in the drift region is realized.

Figure 6B:
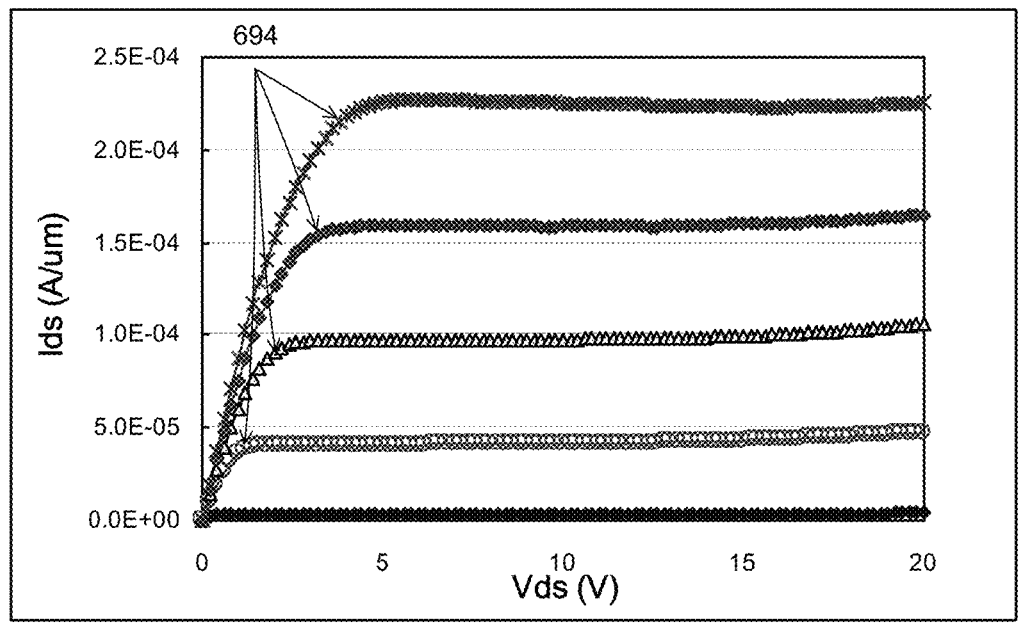
FIG. 6B is a graphical representation of the drain-source voltage to the drain-source current in an extended drain metal oxide semiconductor according to an embodiment of the invention.

FIG. 6B is a graphical representation of the drain-source voltage to the drain-source current in an extended drain metal oxide semiconductor according to an embodiment of the invention. FIG. 6B shows how an EDMOS of the invention with an NDD implant region overcomes the quasi-saturation effect experienced in conventional EDMOS devices. The graph in FIG. 6B shows the $I_{ds}$ in an EDMOS of an embodiment of the invention results in a well-defined current 694 at saturation. In an embodiment of the invention, the response of $I_{ds}$ relative to changes in $V_{ds}$ is substantially linear as it approaches saturation achieving a somewhat constant $I_{ds}$ once a saturation condition is reached—i.e., $I_{ds}$ remains substantially constant or has only slight changes relative to changes in $V_{ds}$ after achieving saturation. A transition region is established between where the curve is substantially linear and the saturation region. As can be calculated from the curve, in certain embodiments of the invention, the slope of a drain-to-source current relative to a drain-to-source voltage in the transition region is at least about $6\times10^{-5}$ ampere/µm-volt as the curve transitions from the substantially linear slope to the saturation region.

Figure 7:
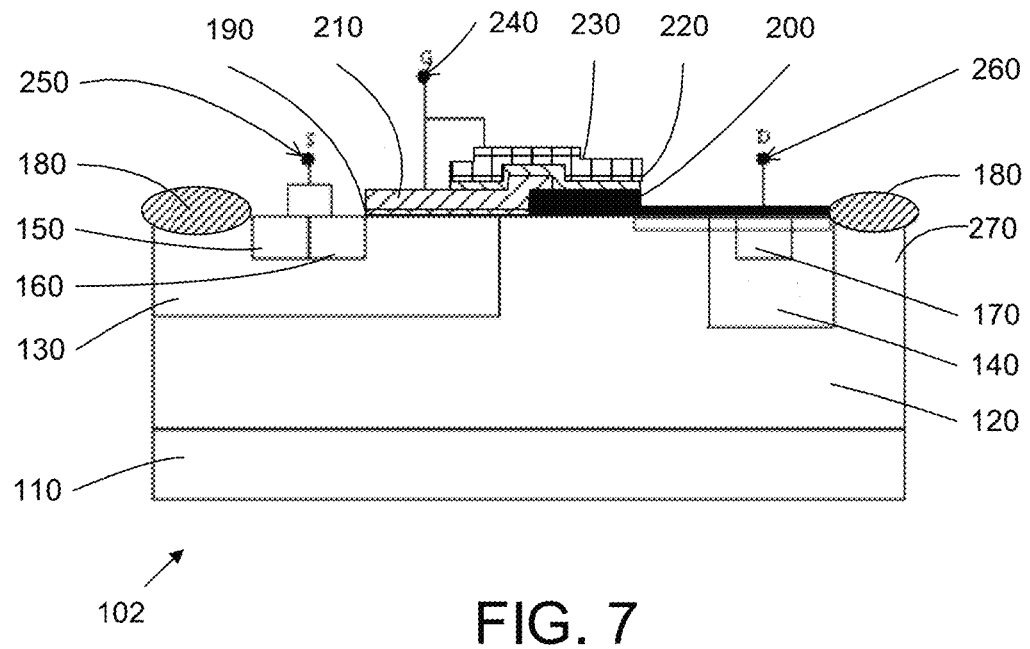
FIG. 7 is a cross-sectional view illustrating an extended drain metal oxide semiconductor transistor according to another embodiment of the invention.

FIG. 7 is a cross-sectional view illustrating an EDMOS transistor according to another embodiment of the invention. The EDMOS 102 of FIG. 7 comprises a substrate 110 upon which is disposed a deep n-type well 120. The EDMOS transistor 102 additionally comprises a p-type well 130 at a source region 250 and an n-type well 140 at a drain region 260. A p doped source region 150 and an n doped source region 160 are disposed in the p-type well 130 and define a contact area for the source region 250. An n doped drain region 170 disposed in the n-type well 140 defines a contact region for the drain region 260.

A dielectric layer 180 defines an outer bound of the p doped source region 150 of the contact area for the source region 250 and an outer bound of the n-type well 140 at the drain region 260. A dielectric layer commences just where the contact area of the source region 250 ends at the n doped source region 160 and continues approximately to an inside boundary of the n-type well 140 at the drain region 260. According to the illustrative embodiment of FIG. 6, this dielectric layer comprises a thin oxide layer 190 and a thick oxide/thin oxide layer 200. In an embodiment of the invention, the thin oxide layer 190 and the thick oxide/thin oxide layer 200 may be a gate oxide layer.

A two conductive layer structure defining the gate region 240 is disposed on the dielectric layer comprising the dual gate oxide layer of the invention. The two conductive layer structure may be configured according to the description of the two conductive layer structure as defined herein associated with FIG. 2 for example.

The EDMOS 102 of FIG. 7 additionally comprises an n⁻ implant 270 is disposed at the drain region 260. According to the illustrative embodiment of FIG. 7, the n⁻ implant 270 may extend across an upper part of the n-type well 140 and the n doped drain region 170. Additionally, the n⁻ implant 270 may extend into the n-type well 140. According to an embodiment of the invention, the n⁻ implant 270 may terminate below the thick oxide/thin oxide layer 200. In certain embodiments of the invention, the n⁻ implant 270 terminates below a stepped down portion of the second polysilicon layer 230 disposed above the HTO layer 220, the thin oxide layer 190, and the thick oxide/thin oxide layer 200. In certain embodiments of the invention, the n⁻ implant 270 may terminate below the two conductive layer structure at about the point where the edge of the second polysilicon layer 230 is aligned with the HTO layer 220. In certain other embodiments of the invention, the n implant 270 may terminate below the two conductive layer structure at about where the edge of the second polysilicon layer 230 is aligned with the HTO layer 220 and the thin oxide layer 190. In certain embodiments of the invention, a concentration of dopant in the n implant 270 is in a range of from about $5\times10^{12}/cm^3$ to about $1\times10^{14}/cm^3$.

Figure 8:
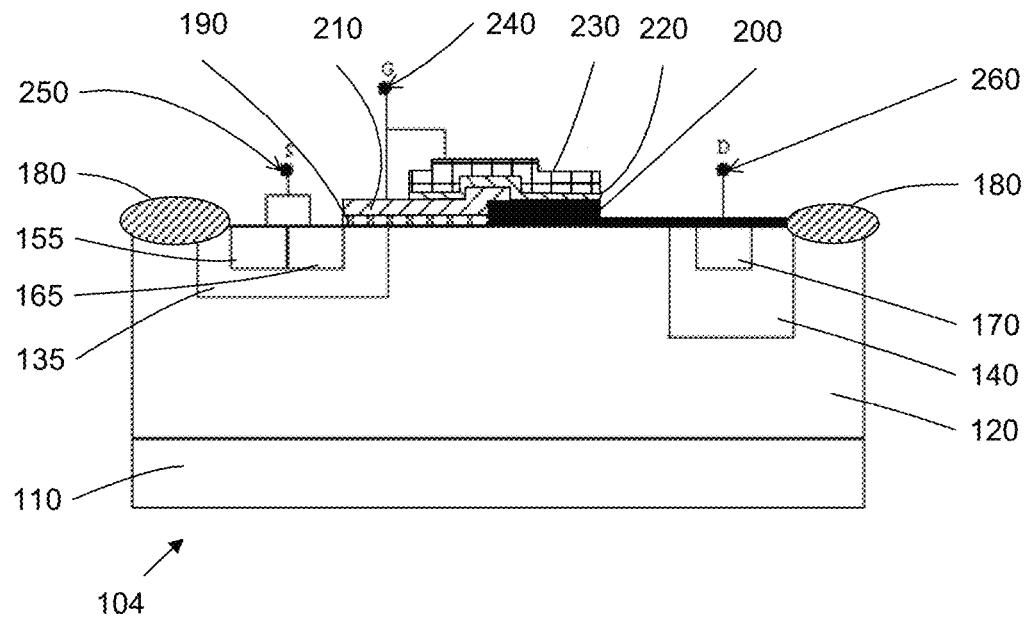
FIG. 8 is a cross-sectional view illustrating an n-laterally doped metal oxide semiconductor transistor according to an embodiment of the invention.

FIG. 8 is a cross-sectional view illustrating an n-laterally doped metal oxide semiconductor (NLDMOS) transistor according to an embodiment of the invention. The NLDMOS 104 of FIG. 8 comprises a substrate 110 upon which is disposed a deep n-type well 120. The EDMOS transistor 102 additionally comprises a p-body region 135 at a source region 250 and an n-type well 140 at a drain region 260. A p doped source region 155 and an n doped source region 165 are disposed in the p-body region 135 and define a contact area for the source region 250. An n doped drain region 170 disposed in the n-type well 140 defines a contact region for the drain region 260.

A dielectric layer 180 defines an outer bound of the p doped source region 155 of the contact area for the source region 250 and an outer bound of the n-type well 140 at the drain region 260. A dielectric layer commences just where the contact area of the source region 250 ends at the n doped source region 160 and continues approximately to an inside boundary of the n-type well 140 at the drain region 260. According to the illustrative embodiment of FIG. 8, this dielectric layer comprises a thin oxide layer 190 and a thick oxide/thin oxide layer 200. In an embodiment of the invention, the thin oxide layer 190 and the thick oxide/thin oxide layer 200 may be a gate oxide layer—i.e., a thin gate oxide layer and a thick gate oxide layer, respectively.

A two conductive layer structure defining the gate region 240 is disposed on dual oxide layer of the invention. The two conductive layer structure may be configured according to the description of the two conductive layer structure as defined herein associated with FIG. 2, for example although the two conductive layer structure may have any other configuration known in the art pursuant to certain embodiments of the invention.

Figure 9:
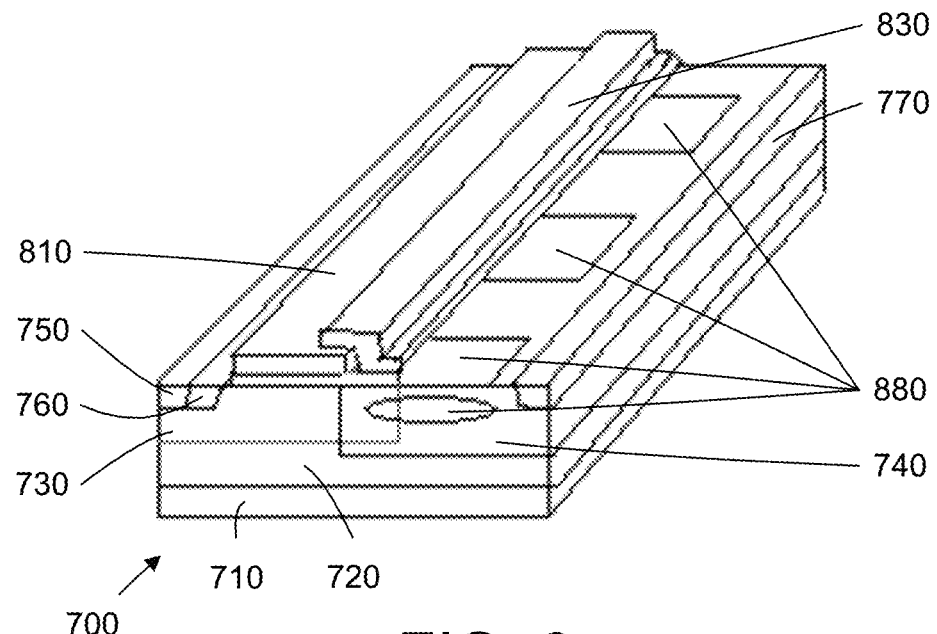
FIG. 9 is a three-dimensional view of a RESURF device according to an embodiment of the invention.

FIG. 9 is a three-dimensional view of a RESURF device according to an embodiment of the invention. FIG. 9 shows an EDMOS 700 having a multi RESURF structure in an exemplary embodiment of the invention. The EDMOS 700 comprises a substrate 710 upon which is disposed a deep n-type well 720. The EDMOS 700 also comprises a p-type well 730 and an n-type well 740. A p doped source region 750 and an n doped source region 760 are disposed in the p-type well 730, while an n doped drain region 770 is disposed in the n-type well 740. The EDMOS 700 comprises a two conductive structure having a first conductive layer or a first polysilicon layer 810 according to this illustrative embodiment and a second conductive layer or a second polysilicon layer 830 according to this illustrative embodiment. The EDMOS 700 of FIG. 9 comprises a plurality of P-drift implants 880 disposed in the n-type well 740.

Figure 10:
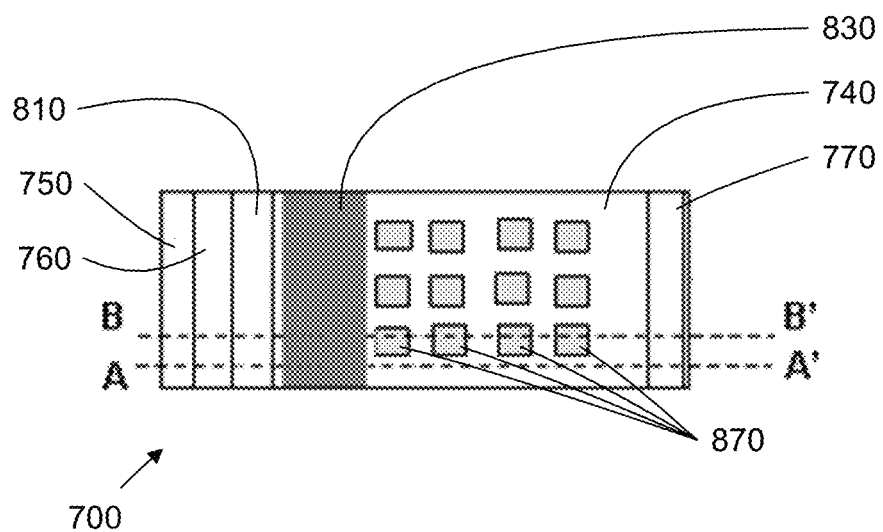
FIG. 10 is a top view of a RESURF device according to an embodiment of the invention.
Figure 11A:
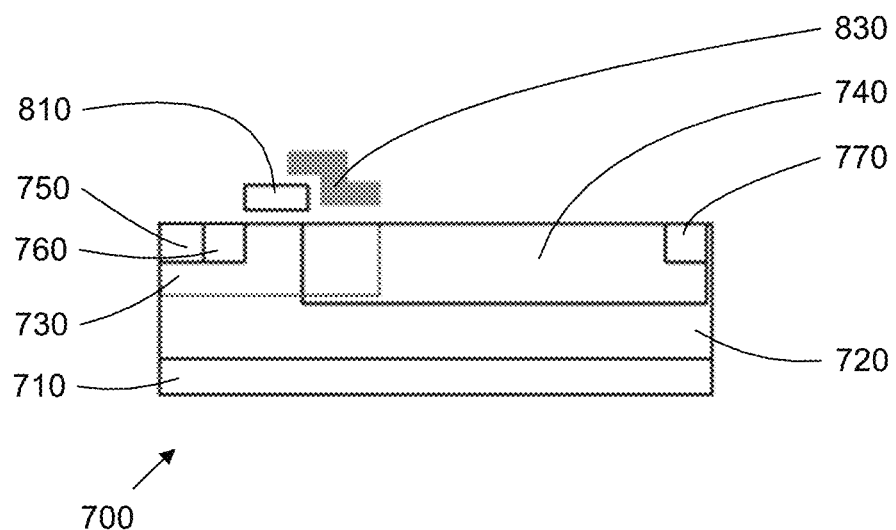
FIG. 11A is a cross-sectional view taken along the AA' line of the RESURF device of FIG. 10.
Figure 11B:
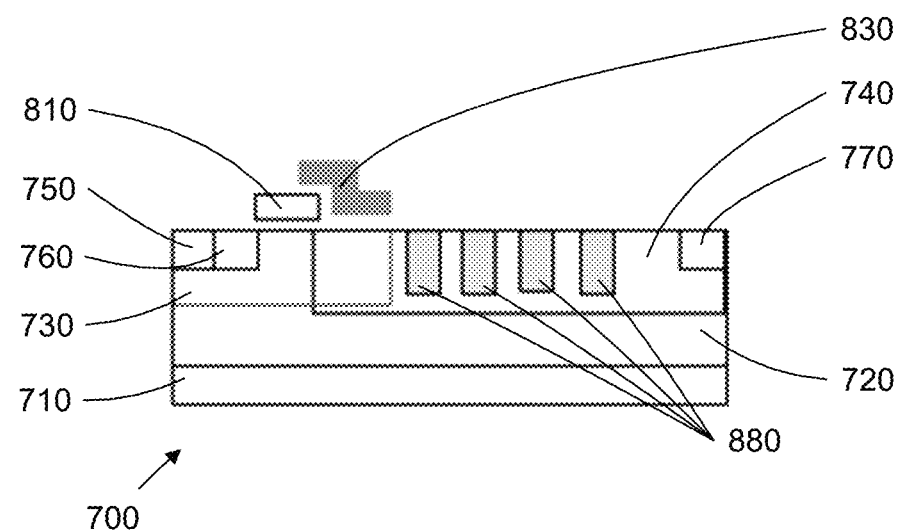
FIG. 11B is a cross-sectional view taken along the BB' line of the RESURF device of FIG. 10.

FIG. 10 is a top view of the LDMOS 700 of FIG. 9. FIG. 10 shows the plurality of P-drift implants 880 are discretely placed and have a rectangular shape according to this illustrative embodiment. FIG. 11A is a cross-section view taken along the AA' line of the RESURF device of FIG. 10 showing a region where the plurality of P-drift implants 880 have not been driven into the n-type well 740. FIG. 11B is a cross-section view taken along the BB' line of the RESURF device of FIG. 10 showing the penetration of the discretely positioned plurality of P-drift implants 880 defining a p-drift region in the n-type well 740.

While the semiconductor device of FIG. 9 is directed toward a multi RESURF structure of the invention in a high voltage device, the dual oxide gate structure and multi RESURF structure of the invention may also be applicable to semiconductor devices including high voltage devices.

Figure 12:
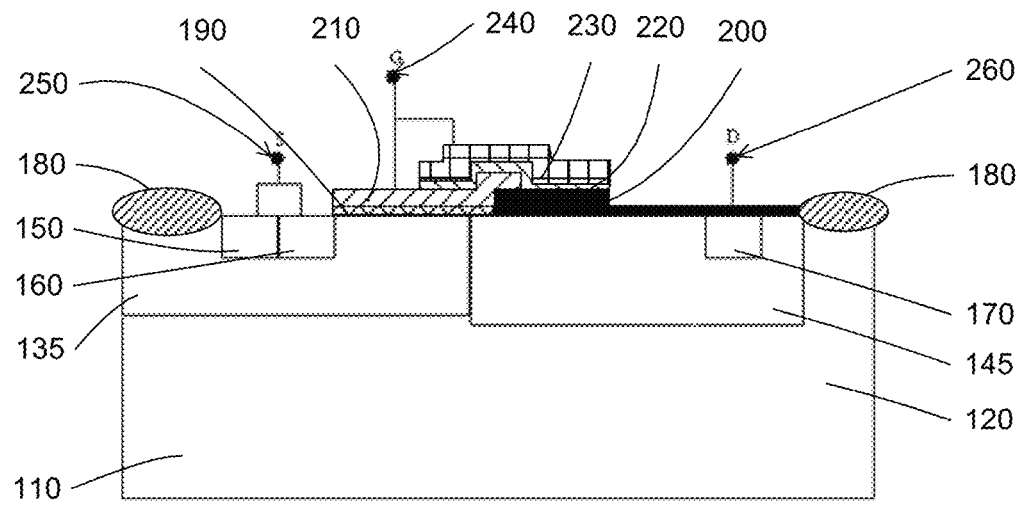
FIG. 12 is a cross-sectional view illustrating an extended drain metal oxide semiconductor transistor according to another embodiment of the invention.

In an embodiment of the invention, the deep n-type well may be replaced by an n-type well to form a low side n-channel metal oxide semiconductor (NMOS) device. FIG. 12 is a cross-sectional view illustrating an EDMOS transistor according to another embodiment of the invention. The EDMOS 106 of FIG. 12 comprises a substrate 110, for example, a p-type substrate or even an epitaxial substrate and a p-type well 135 substantially aligned with an n-type well 145. The other elements of this exemplary device including the dual oxide structure of the invention are substantially as described herein.

The first conductive layer or the first polysilicon layer according to certain embodiments of the invention and the second conductive layer or the second polysilicon layer according to certain embodiments of the invention may be configured to have different biased voltages. In certain embodiments of the invention, bias voltages of the first conductive layer and the second conductive layer may be in a range of from about 0 V to about 28 V, according to certain other embodiments of the invention.

Figure 13:
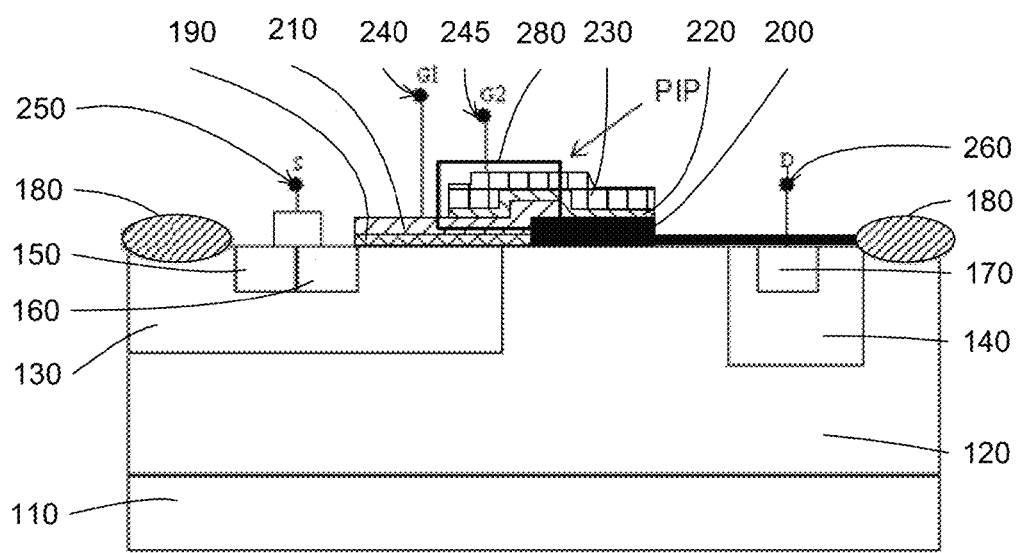
FIG. 13 is a cross-sectional view illustrating an extended drain metal oxide semiconductor transistor having a polysilicon-insulator-polysilicon (PIP) capacitor according to an embodiment of the invention.

For example, in an embodiment of the invention, a polysilicon-insulator-polysilicon (PIP) capacitor structure may be used to provide a first polysilicon layer and a silicon polysilicon layer having different bias voltages. FIG. 13 is a cross-sectional view illustrating an EDMOS 108 transistor having a PIP capacitor 280 according to an embodiment of the invention. A HTO layer 220 of the PIP capacitor 280 may be used to achieve a desired unit capacitance, according to certain embodiments of the invention.

In an embodiment of the invention, a total thickness of the thick oxide/thin oxide layer 200 and the HTO layer 220 may generally provide a higher drain breakdown voltage, but, according to certain embodiments of the invention, the total thickness of thick oxide/thin oxide layer 200 and the HTO layer 220 is configured to be thinner than a field oxide layer or the oxide of the shallow trench isolation structure.

The semiconductor devices of the invention may be fabricated from many different types of layers including, but not limited to n-type epitaxial layers, p-type epitaxial layers, n-type non-epitaxial layers, p-type non-epitaxial layers, n-type silicon-on-insulator (SOI) layers, and/or p-type SOI layers. The structures of the invention may be incorporated into many types of semiconductor devices including, but not limited to, for example, n-channel EDMOS, p-channel EDMOS, n-channel LDMOS, and p-channel LDMOS.

The semiconductor devices of the invention may have any type of geometrical structure. Certain exemplary embodiments of geometrical structures of the invention are included, for example, in FIGS. 14A to 14E. Generally, the structures are defined by a source region 950, 1050, 1150, 1250, 1350 having an n doped source region 910, 1010, 1110, 1210, 1310 and a p doped source region 920, 1020, 1120, 1220, 1320 and a drain region 970, 1070, 1170, 1270, 1370 having an n doped drain region 960, 1060, 1160, 1260, 1360. The two conductive layer structure of these exemplary embodiments comprise a first polysilicon layer 930, 1040, 1140, 1240, 1340 and a second polysilicon layer 940, 1040, 1140, 1240, 1340.

Figure 14A:
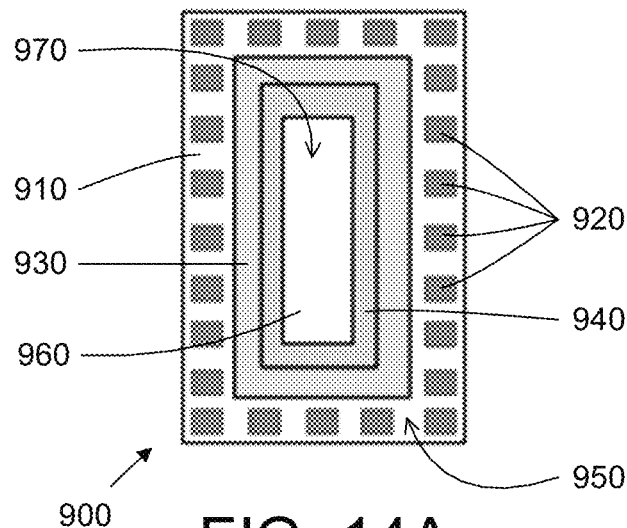
FIG. 14A is a top view of an extended drain n-channel metal oxide semiconductor transistor according to an embodiment of the invention.
Figure 14B:
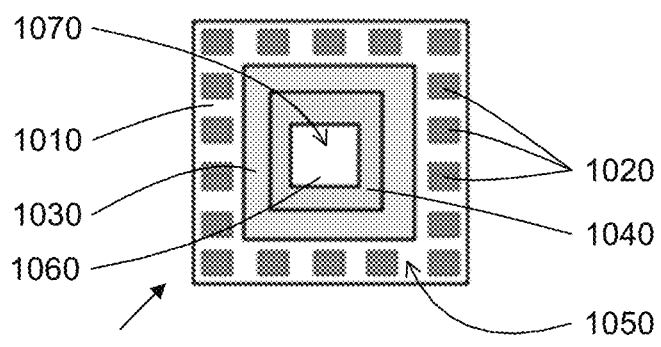
FIG. 14B is a top view of an extended drain n-channel metal oxide semiconductor transistor according to another embodiment of the invention.
Figure 14C:
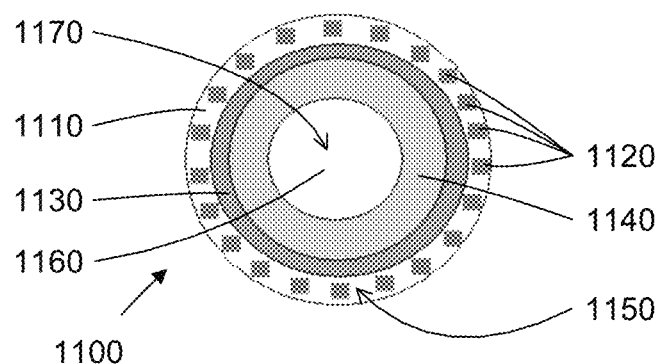
FIG. 14C is a top view of an extended drain n-channel metal oxide semiconductor transistor according to another embodiment of the invention.

FIG. 14A is a top view of an extended drain n-channel metal oxide semiconductor transistor according to an embodiment of the invention having a rectangular structure. FIG. 14B is a top view of an extended drain n-channel metal oxide semiconductor transistor according to another embodiment of the invention. FIG. 14C is a top view of an extended drain n-channel metal oxide semiconductor transistor according to another embodiment of the invention.

Figure 14D:
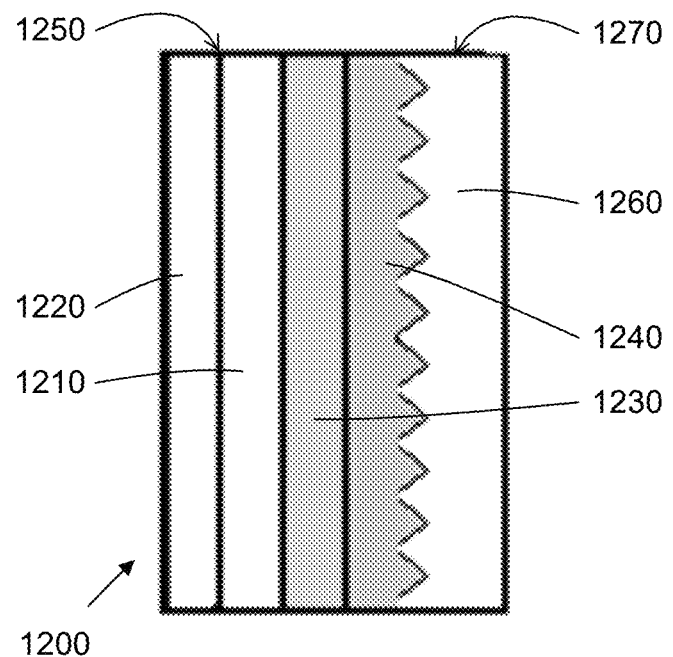
FIG. 14D is a top view of an extended drain n-channel metal oxide semiconductor transistor according to another embodiment of the invention.
Figure 14E:
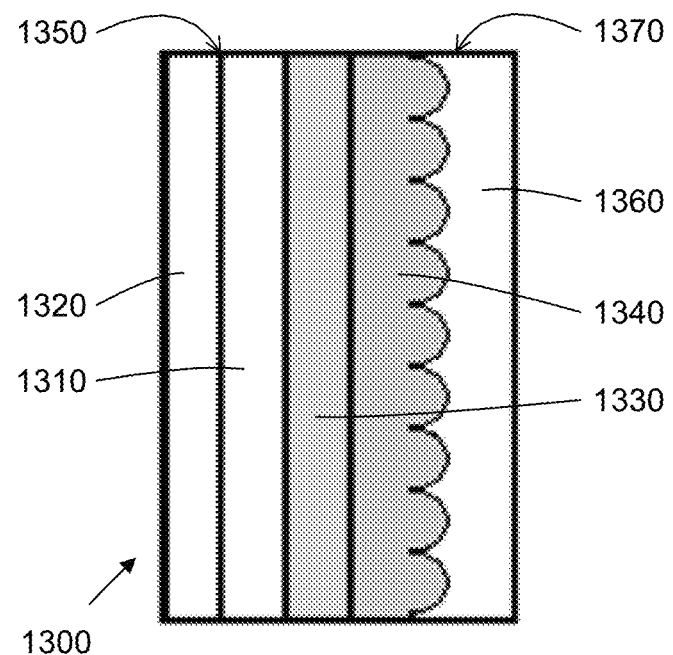
FIG. 14E is a top view of an extended drain n-channel metal oxide semiconductor transistor according to another embodiment of the invention.

FIG. 14D is a top view of an extended drain n-channel metal oxide semiconductor transistor according to another embodiment of the invention where the second polysilicon layer 1240 has a toothed structure. FIG. 14E is a top view of an extended drain n-type metal oxide semiconductor transistor according to another embodiment of the invention where the second polysilicon layer 1240 has a round tooth structure.

Figure 15A:
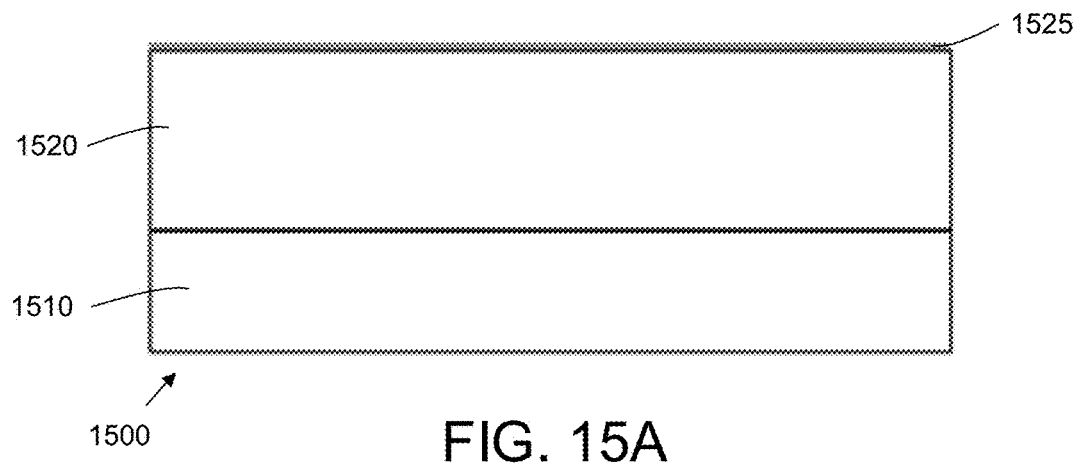
FIGS. 15A-15H are cross sectional views of a semiconductor device after completion of various steps of fabricating such a device, according to an embodiment of the invention.
Figure 16:
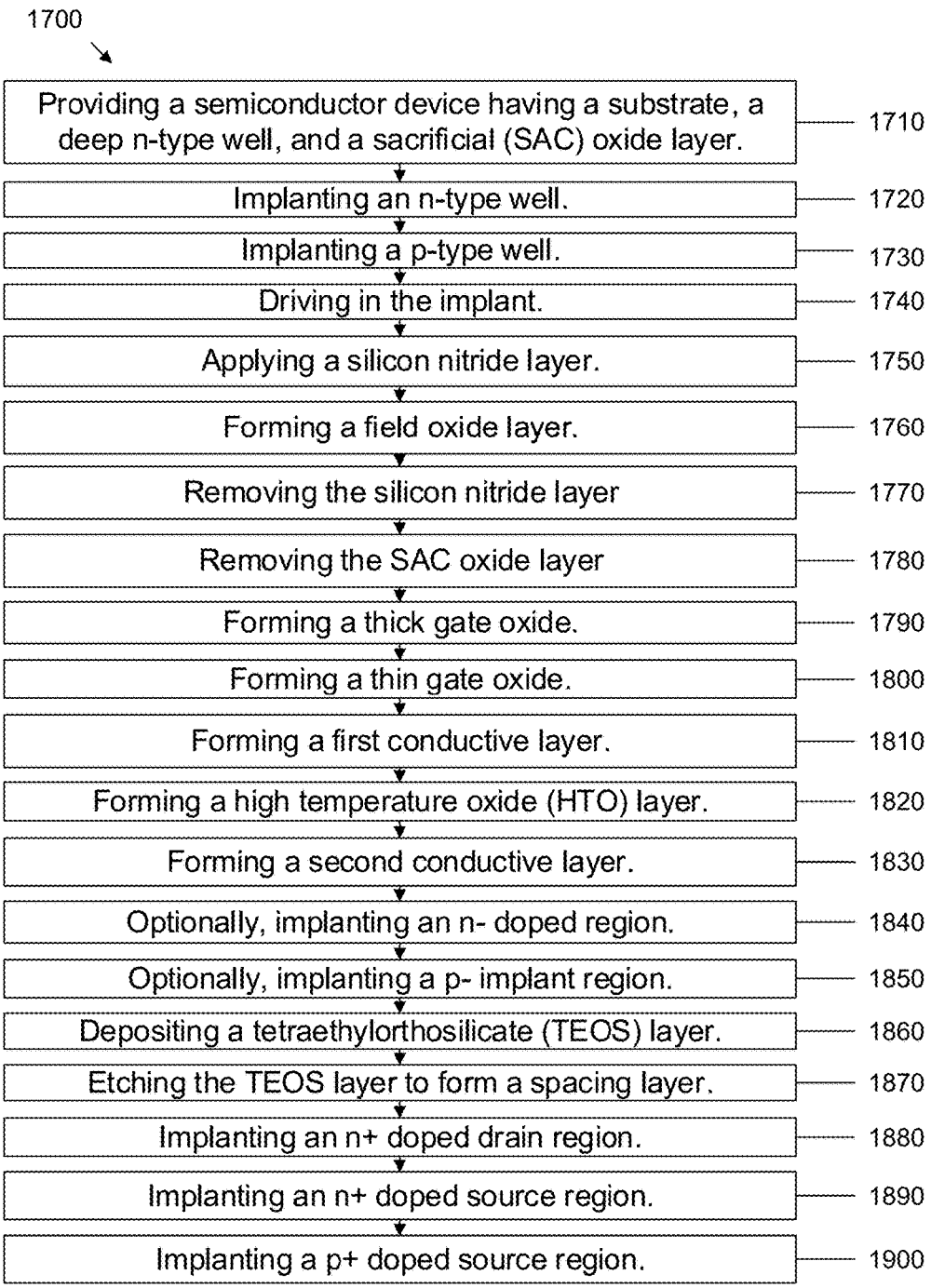
FIG. 16 is a process flow diagram showing the various steps of manufacturing a semiconductor device, according to an embodiment of the invention.

An aspect of the invention provides a method of fabricating a semiconductor device such as an extended drain metal oxide semiconductor transistor. As shown in FIG. 16, a method of fabricating an EDMOS transistor 1700 may comprise providing a semiconductor device having a substrate, a deep-n-type well, and an oxide layer or, more particularly, a sacrificial (SAC) oxide layer 1710, according to an embodiment of the invention. FIG. 15A illustrates, according to an embodiment of the invention for example, a semiconductor device 1500 having a substrate 1510 in which a deep n-type well 1520 has been implanted upon which a SAC oxide layer 1525 has been formed.

Figure 15B:
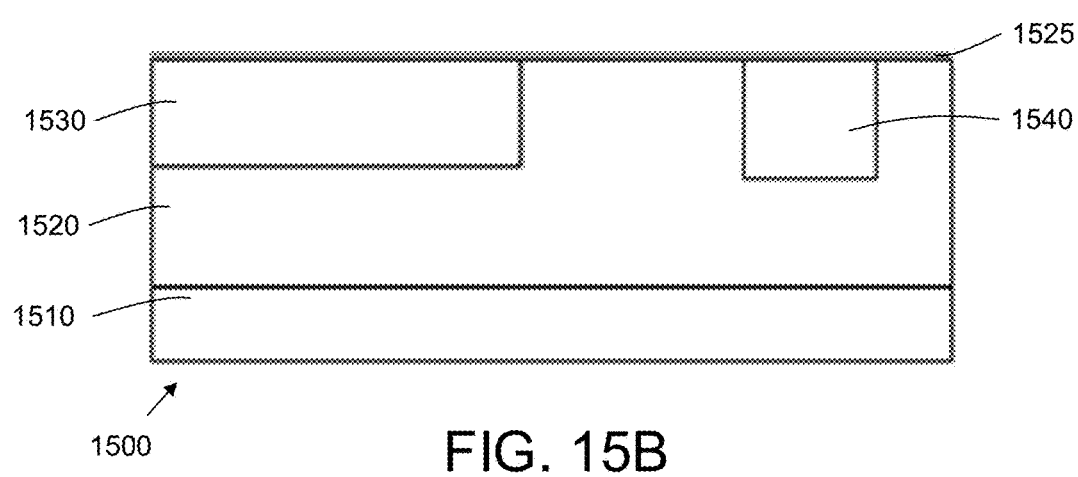

The method of fabricating an EDMOS transistor may additionally comprise the steps of implanting a p-type well 1730 and implanting an n-type well 1720 or vice versa. For example the steps of implanting an n-type well 1720 and implanting a p-type well 1730, for example, may include various sub-steps as known by a person having ordinary skill in the art. In certain embodiments of the invention, these implantation steps may be use photolithography that may include the steps of applying one or more photoresists followed by the removal of any photoresist masking layers, which facilitate the implantation of the p-type well and the n-type well. These steps of implanting an n-type well 1720 and implanting a p-type well 1730 may additionally comprise the step of driving in the implant 1740. Without intending to be limiting, the driving in process may facilitate the deeper penetration of implant ions into the layer. FIG. 15B shows an exemplary embodiment of the semiconductor device 1500 after completion of these steps having a p-type well 1530 and an n-type well 1540.

Figure 15C:
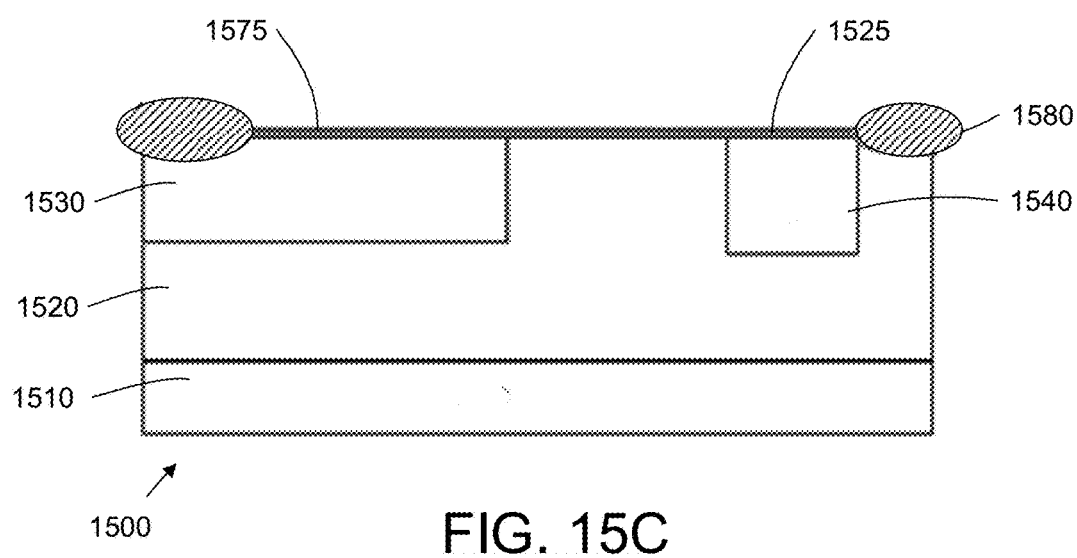

The method of fabricating an EDMOS transistor may additionally comprise applying a silicon nitride layer 1750. The step of applying a silicon nitride layer 1750 may, according to certain embodiments of the invention, also include performing a diffusion, photo-resist patterning, etching, and perhaps a deposition one or more times across the semiconductor device. The method of fabricating an EDMOS transistor may additionally comprise forming a field oxide layer 1760. Again, the step of forming a field oxide 1760 may itself comprise several sub-steps that may include, for example, but without intending to be limiting, etching, applying a pad layer, applying one or more resistive layers, forming a spacer layer, further etching, etc. FIG. 15C shows an exemplary embodiment of the semiconductor device 1500 after completion of these steps having a silicon nitride layer 1585 and a field oxide layer 1580.

Figure 15D:
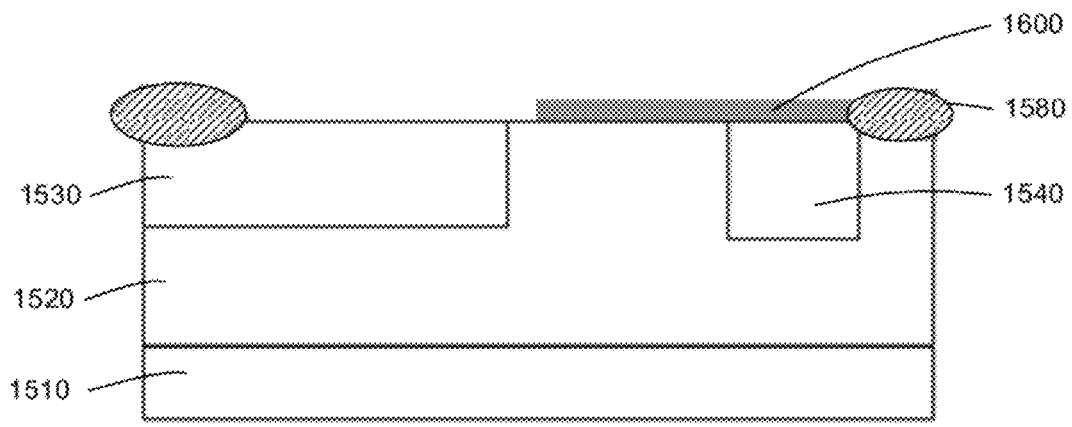

The method of fabricating an EDMOS transistor may additionally comprise removing the silicon nitride layer 1770, removing the SAC oxide layer 1780, and forming a thick gate oxide 1790. In an embodiment of the invention, the step of forming the thick gate oxide 1790 may comprise the steps of depositing a thick gate oxide layer, applying a thick gate oxide photoresist layer, etching the thick gate oxide layer, and removing the thick gate photoresist layer resulting in the formation of the thick gate oxide. FIG. 15D shows an exemplary embodiment of the semiconductor device 1500 after completion of these steps showing the removal of the SAC oxide layer 1525 and the silicon nitride layer 1575 and the resulting formation of the thick gate oxide 1600.

Figure 15E:
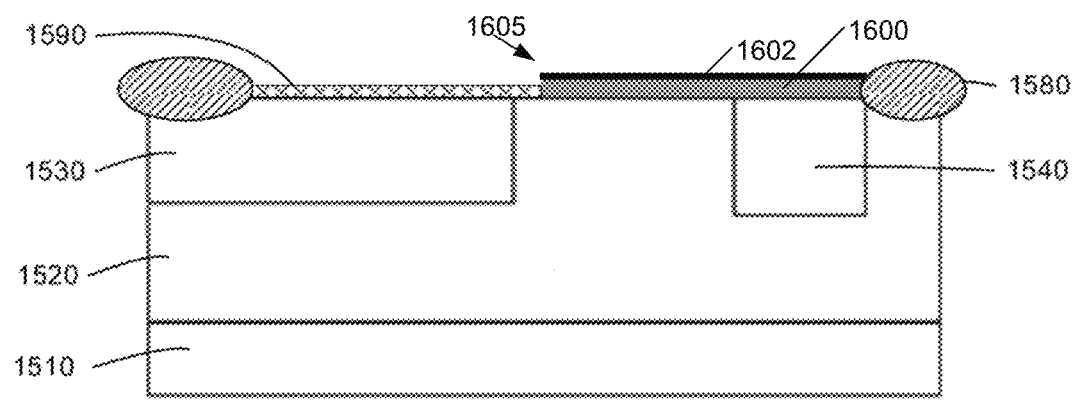

The method of fabricating an EDMOS transistor may comprise forming a thin gate oxide 1800. FIG. 15E shows an exemplary embodiment of the semiconductor device 1500 after completion of the step of forming a thin gate oxide 1800 resulting in the formation of the thin gate oxide 1590. Additionally, a thin oxide layer, acting for example as an isolation layer 1602, in combination with the thick gate oxide 1600 forms a thick gate oxide and thin oxide layer 1605.

Figure 15F:
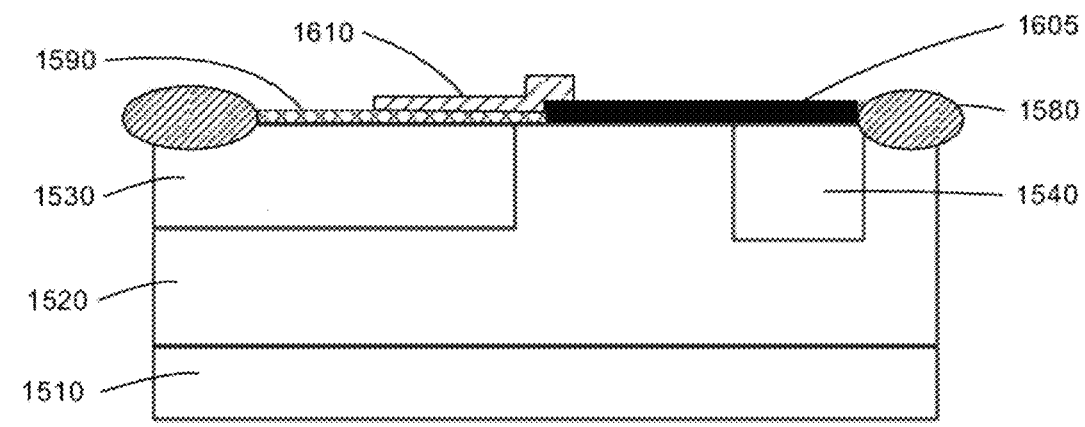

The method of fabricating an EDMOS transistor may comprise the step of forming a first conductive layer 1810. In certain embodiments of the invention, the first conductive layer may comprise a first polysilicon layer. According to an embodiment of the invention, the step of forming a first conductive layer, may comprise the steps of depositing a first conductive layer, applying a first conductive photoresist layer, etching the first conductive layer, and removing the first conductive photoresist layer. FIG. 15F shows an exemplary embodiment of the semiconductor device 1500 after completion of the step of forming a first conductive layer 1800 resulting in the formation of the first conductive layer 1610.

Figure 15G:
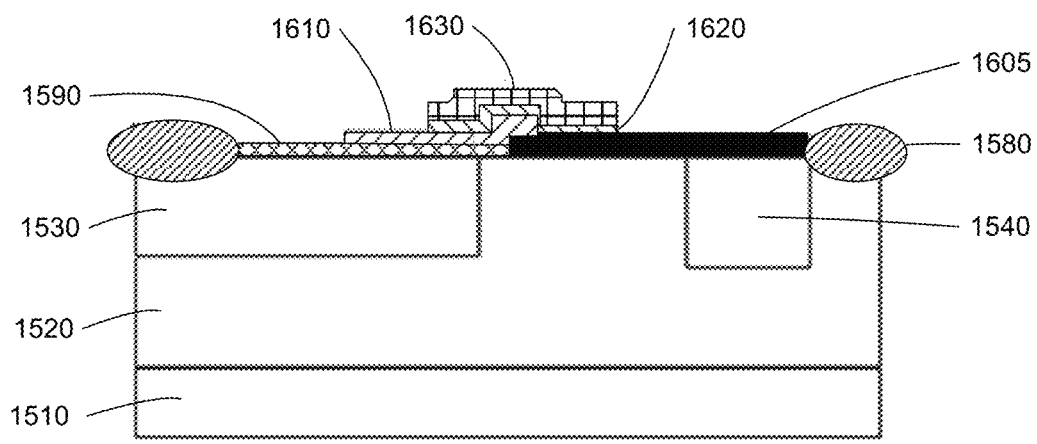

The method of fabricating an EDMOS transistor may comprise the steps of applying a high temperature oxide (HTO) layer 1820 and forming a second conductive layer 1830. In certain embodiments of the invention, the second conductive layer may comprise a polysilicon layer. According to an embodiment of the invention, the step of forming a second conductive layer, may comprise the steps of depositing a second conductive layer, applying a second conductive photoresist layer, etching the second conductive layer, and removing the second conductive photoresist layer. FIG. 15G shows an exemplary embodiment of the semiconductor device 1500 after completion of the aforementioned steps providing a HTO layer 1620 and a second conductive layer 1630.

The method of fabricating an EDMOS transistor may comprise the steps of optionally, implanting an n− doped region 1840; optionally, implanting a p− implant region 1850; depositing a dielectric layer such as a tetraethyl orthosilicate (TEOS) layer 1860; and, according to certain embodiments of the invention, etching the dielectric layer or TEOS layer to form a spacing layer 1870. In certain embodiments of the invention, the dielectric layer or TEOS layer may be etched to form a spacing layer disposed, at least in part, along an edge of the first conductive layer. The method of fabricating an EDMOS transistor may additionally comprise the steps of implanting an n+ doped drain region 1880; implanting an n+ doped source region 1890; and implanting a p+ doped source region 1900. The order of these steps is not necessarily important, according to an embodiment of the invention. The ion implantation steps, according to certain embodiments of the invention, may involve applying a photoresist layer to mask the desired area where the ions will be implanted, implanting the respective ions, and removing the photoresist layer. These steps may be performed repetitively until each of the regions are implanted.

Figure 15H:
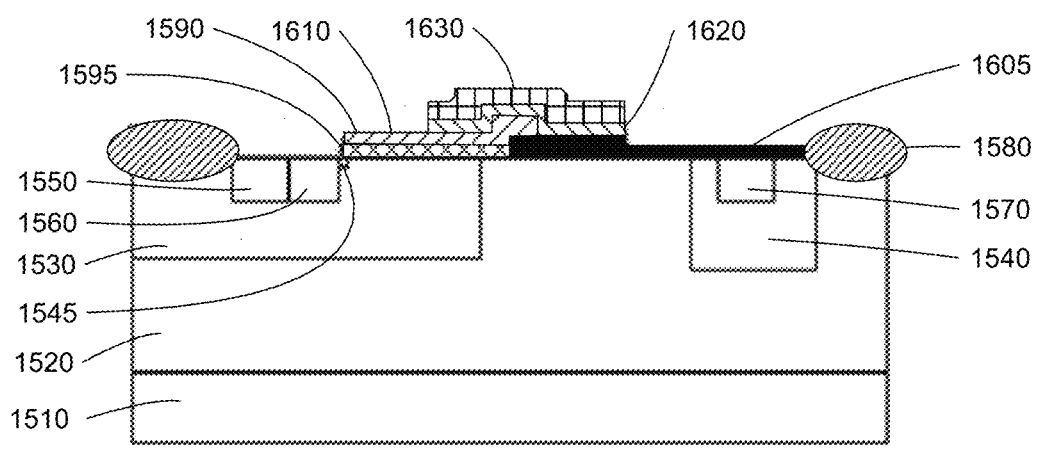

FIG. 15H shows an exemplary embodiment of the semiconductor device 1500 after completion of the aforementioned steps to provide an n− doped region 1545, a p+ doped source region 1550, a n+ doped source region 1560, an n+ doped drain region 1570, and a spacing (SPR) layer 1595. The SPR layer 1595 may have a width of from about 100 Å to about 500 Å.

An aspect of the invention provides methods of fabricating semiconductor device of the invention. Any manufacturing process known to those having ordinary skill in the art having the benefit of this disclosure may be used to manufacture the semiconductor devices of the invention.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe exemplary embodiments in the context of certain exemplary combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. A high voltage metal oxide semiconductor (HVMOS) transistor comprising:
   a substrate;
   a dual gate oxide structure disposed on the substrate having
      a thick gate oxide layer,
      a thin gate oxide layer directly adjacent to the thick gate oxide layer, and
      an isolation layer disposed upon the thick gate oxide layer; and
   a two conductive layer structure having
      a first conductive layer disposed along the thin gate oxide layer having a stepped portion disposed at least in part along the thick gate oxide layer,
      a second conductive layer disposed above a portion of the first conductive layer and the thick gate oxide layer, wherein the first conductive layer and the second conductive layer are electrically connected, wherein the second conductive layer comprises (a) a first portion disposed above a portion of the first conductive layer that is not the stepped portion of the first conductive layer, (b) a second portion disposed above the stepped portion of the first conductive layer, and (c) a third portion that is not disposed above the first conductive layer, wherein the second portion is disposed at a normal distance further from the substrate than the first and second portions,
      an inter-conductor oxide layer disposed between the second conductive layer and the portion of the first conductive layer and the thick gate oxide layer;
      an n-well disposed in the substrate and disposed along a normal to a plane defined by a surface of the dual gate oxide structure opposite the first and second conductive layers and, at least in part, directly below the dual gate oxide structure; and
      a p-well disposed in the substrate and disposed along the normal to the plane and, at least in part, directly below the dual gate oxide structure, the p-well partly overlapping the n-well, the overlap of the p-well and the n-well being directly below both the thin gate oxide layer and the thick gate oxide layer.

2. The HVMOS transistor of claim 1, wherein the inter-conductor oxide layer comprises a high temperature oxide.

3. The HVMOS transistor of claim 1, additionally comprising an n⁻ well disposed in the substrate below the two conductive layer structure and a p-type implant disposed in the n⁻ well.

4. The HVMOS transistor of claim 3, wherein a p-type ion of the p-type implant is selected such that the p-type ion is subject to out-diffusion.

5. The HVMOS transistor of claim 3, wherein a concentration of dopant in the p-type implant is in a range of from about $5\times10^{12}/cm^3$ to about $1\times10^{14}/cm^3$.

6. The HVMOS transistor of claim 3, wherein a reduction of an effective channel length of the HVMOS transistor is in a range of from about 0.2 µm to about 1 µm in comparison to an HVMOS transistor not having the dual gate oxide structure, the p-type implant, and the n⁻ well.

7. The HVMOS transistor of claim 1, additionally comprising an n-type doped drain (NDD) area disposed in the substrate extending from a drain region to a point below the two conductive layer structure.

8. The HVMOS transistor of claim 7, wherein a reduction of an effective channel length of the HVMOS transistor is in a range of from about 0.2 µm to about 1µm in comparison to an HVMOS transistor not having the dual gate oxide structure and the NDD area.

9. The HVMOS transistor of claim 7, wherein the HVMOS transistor is substantially free of a quasi-saturation region.

10. The HVMOS transistor of claim 9, wherein a slope of a drain-to-source current relative to a drain-to-source voltage is at least about $6\times10^{-5}$ ampere/µm-volt in a transition region between a substantially linear slope and a saturation region.

11. The HVMOS transistor of claim 1, additionally comprising an n⁻ implant disposed in the substrate that extends across an upper part of an n-type well and an n doped drain region and terminates at a point below the thick gate oxide layer.

12. The HVMOS transistor of claim 11, wherein the n⁻ implant terminates below the two conductive layer structure at about the point where an edge of the second conductive layer is aligned with the inter-conductor oxide layer and the isolation layer.

13. The HVMOS transistor of claim 1, the substrate comprising
   a p-body region; and
   a p doped source region and an n doped source region each disposed in the p-body region configured to define a contact area for a source region.

14. The HVMOS transistor of claim 1, additionally comprising
   a p-type well having a p doped source region and an n doped source region that define a contact area for a source region; and
   an n-type well adjacent to the p-type well, the n-type well having an n doped drain regain that defines a contact area for a drain region.

15. The HVMOS of claim 1, wherein the first conductive layer is a first polysilicon layer and the second conductive layer is a second polysilicon layer.

16. The HVMOS of claim 15, wherein the two conductive layer structure is configured to define a poly-insulator-poly (PIP) capacitor.

* * * * *